United States Patent
Wang et al.

(10) Patent No.: US 6,518,185 B1
(45) Date of Patent: Feb. 11, 2003

(54) INTEGRATION SCHEME FOR NON-FEATURE-SIZE DEPENDENT CU-ALLOY INTRODUCTION

(75) Inventors: Pin-Chin Connie Wang, Menlo Park, CA (US); Fei Wang, San Jose, CA (US); Kashmir Sahota, Fremont, CA (US); Steven Avanzino, Cupertino, CA (US); Amit Marathe, Milpitas, CA (US); Matthew Buynoski, Palo Alto, CA (US); Ercan Adem, Sunnyvale, CA (US); Christy Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/127,521

(22) Filed: Apr. 22, 2002

(51) Int. Cl.$^7$ ................................................ H01L 21/44
(52) U.S. Cl. ...................... 438/687; 438/629; 438/631; 438/633; 438/642; 438/652; 438/658; 438/659; 438/672
(58) Field of Search ................................ 438/687, 629, 438/631, 633, 642, 652, 658, 659, 672

(56) References Cited

U.S. PATENT DOCUMENTS

| | | | |
|---|---|---|---|
| 6,022,808 A | | 2/2000 | Nogami et al. ............... 438/694 |
| 6,037,257 A | * | 3/2000 | Chiang et al. ............... 438/687 |
| 6,110,817 A | * | 8/2000 | Tsai et al. .................... 438/687 |
| 6,124,205 A | * | 9/2000 | Doan ........................... 438/687 |
| 6,207,222 B1 | * | 3/2001 | Chen et al. .................. 438/629 |
| 6,268,291 B1 | * | 7/2001 | Andricacos et al. ......... 438/687 |
| 6,346,479 B1 | | 2/2002 | Woo et al. .................... 438/687 |
| 6,395,628 B1 | * | 5/2002 | Doan ........................... 438/672 |

* cited by examiner

Primary Examiner—John F. Niebling
Assistant Examiner—Lynne A. Gurley

(57) ABSTRACT

In the present method of fabricating a semiconductor device, openings of different configurations (for example, different aspect ratios) are provided in a dielectric layer. Substantially undoped copper is deposited over the dielectric layer, filling the openings and extending above the dielectric layer, the different configurations of the openings providing an upper surface of the substantially undoped copper that is generally non-planar. A portion of the substantially undoped copper is removed to provide a substantially planar upper surface thereof, and a layer of doped copper is deposited on the upper surface of the substantially undoped copper. An anneal step is undertaken to difffuse the doping element into the copper in the openings.

12 Claims, 7 Drawing Sheets

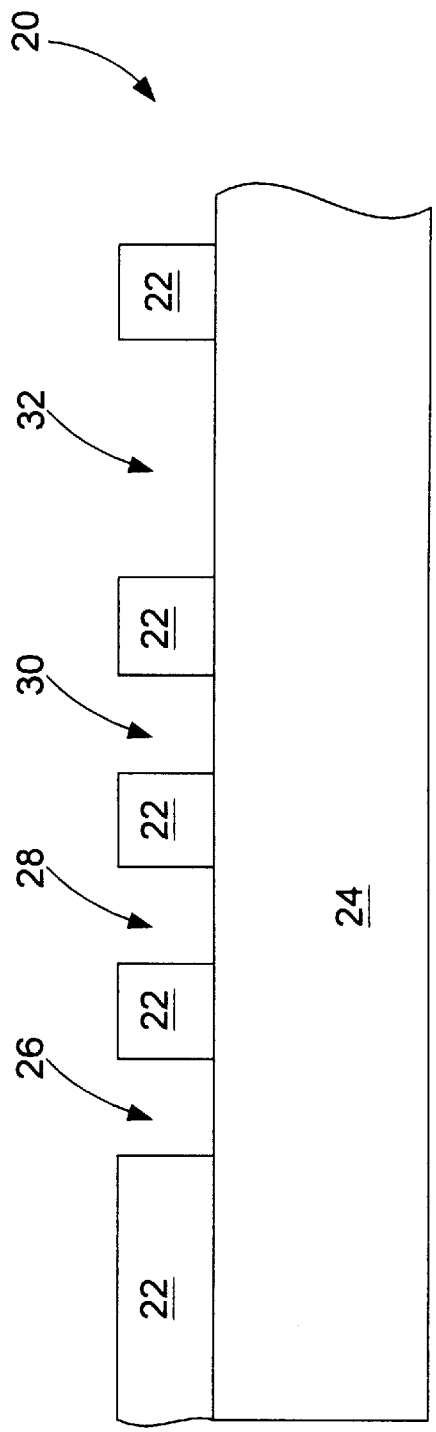
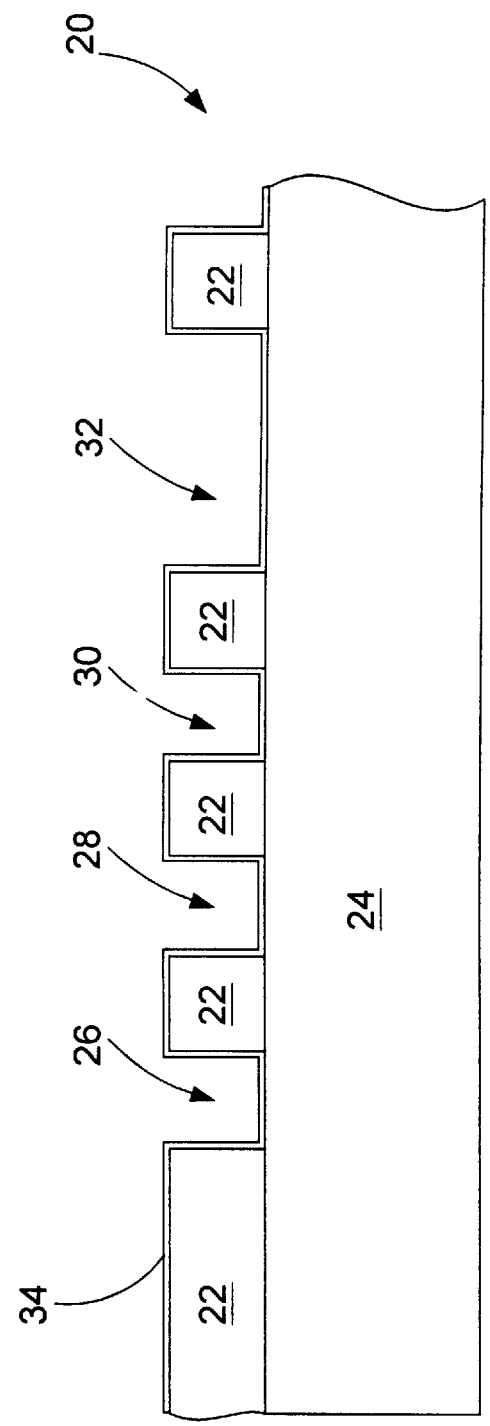

US 6,518,185 B1

INTEGRATION SCHEME FOR NON-FEATURE-SIZE DEPENDENT CU-ALLOY INTRODUCTION

BACKGROUND OF THE INVENTION

1. Technical Field

This invention relates generally to a method of forming copper interconnects having high electromigration resistance.

2. Background Art

Recently, copper has received considerable attention as a candidate for replacing aluminum and/or tungsten in wiring and interconnection technology for very large-scale integration (VLSI) and ultra-large-scale integration (ULSI) applications. In particular, copper has a lower resistivity than aluminum or tungsten, and in addition has high conformality and filling capability for deposition in via holes and trenches, along with low deposition temperature.

However, a disadvantage of copper is that it exhibits poor electromigration resistance. That is, with current flow through a copper conductor, copper atoms may migrate to cause a break in the metal.

U.S. Pat. No. 6,022,808 to Nogami et al., issued Feb. 8, 2000, and assigned to the Assignee of this invention (herein incorporated by reference), discloses a method for improving the electromigration resistance of copper in this environment. In furtherance thereof, interconnects are formed in vias and/or trenches in a dielectric by depositing undoped copper, and then a copper layer containing a depant element is deposited on the undoped copper. An annealing step is undertaken to diffuse dopant into the previously undoped copper, thereby improving the electromigration resistance of the copper. Also of general interest is U.S. Pat. No. 6,346, 479 to Woo et al., issued on Feb. 12, 2002 and assigned to the Assignee of this invention (herein incorporated by reference).

While this method is significantly advantageous, a device environment with varying feature sizes presents special problems, as will now be described with reference to FIGS. 1–6.

FIG. 1 is a cross-section of a semiconductor device 20 illustrating a step in a prior process. As shown therein, a dielectric layer 22, such as silicon dioxide or other material having a low dielectric constant, is formed above a semiconductor substrate 24, typically comprising monocrystalline silicon. It should be understood, however, that dielectric layer 22 may be an interlayer dielectric a number of layers above the surface of the semiconductor substrate 24.

Openings 26, 28, 30, 32 are formed in the dielectric layer 22 using conventional photolithographic and etching techniques. These openings 26–32 represent holes for forming contacts or vias or trenches for forming interconnect lines. As shown in FIG. 1, openings 26–32 each have the same depth, and the widths of the openings 26, 28, 30 are substantially the same, while the width of the opening 32 is substantially greater than the widths of the openings 26, 28, 30. Thus, openings 26, 28, 30 have high aspect ratios, and opening 32 has a lower aspect ratio. With reference to FIG. 2, if chosen, a layer 34 may be included, made up of a diffusion barrier layer deposited over the structure, and a copper seed layer deposited over the diffusion barrier layer, as is well-known and described in the above cited patents.

FIG. 3 illustrates the step of depositing an undoped copper layer 36 over the resulting structure by, for example, electroplating. The undoped copper 36 fills the openings 26, 28, 30, 32 and is deposited to define an upper surface 38 which extends above the dielectric layer 22. As will be seen in FIG. 3, because of the small features defined by the openings 26, 28, 30, and their close proximity, the surface portion 38A over those openings 26, 28, 30 is generally planar in configuration. However, because of the substantially greater width of the opening 32, the surface portion 38B over the opening 32 is recessed relative to the surface portion 38A over the openings 26, 28, 30, causing the overall upper surface 38 of the copper 36 to be substantially non-planar.

Next, as illustrated in FIG. 4, a layer of doped copper 40 is sputter deposited on the undoped copper layer 36. Annealing is then undertaking to difffuse dopant element atoms 42 from doped copper layer 40 into undoped copper layer 36 (FIG. 5).

During this step, because of the substantial planarity of the surface portion 38A over the openings 26, 28,30, the copper 36 in each opening 26, 28, 30 will be doped generally to the same concentration. However, because the surface portion 38B of the copper layer 36 is recessed over the opening (causing reduced volume of copper under the layer 40 adjacent the opening 32), the concentration of dopant 42 in the copper 36 in opening 32 will be substantially higher. After chemical mechanical polishing (CMP) to provide that the surface of the copper 36 in each opening 26, 28,30, 32 is coplanar with the upper surface of the dielectric layer 22, it will be seen that features 36A, 36B, 36C, 36D are formed, with feature 36D being of a configuration different from features 36A, 36B, 36C. In accordance with the analysis above, concentration of dopant 42 in the feature 36D is higher than in any of the features 36A, 36B, 36C, i.e., concentration of dopant 42 is dependent on feature size. Thus, uniformity in electromigration resistance from feature to feature is not achieved.

Therefore, what is needed is a method for providing substantially uniform concentration of dopant material in copper interconnects of the varying features size.

DISCLOSURE OF THE INVENTION

In the present method of fabricating a semiconductor device, openings of different configurations, for example, different aspect ratios are provided in a dielectric layer. Substantially undoped copper is deposited over the dielectric layer, filling the openings and extending above the dielectric layer, the different configurations of the openings providing an upper surface of the substantially undoped copper that is generally non-planar. A portion of the substantially undoped copper is removed to increase the planarity of the upper surface thereof, and a layer of doped copper is deposited on the upper surface of the substantially undoped copper. An anneal step is undertaken to diffuse the doping element into the copper in the openings.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIGS. 1–6 are cross-sectional views illustrating steps of a process of the prior art.

BEST MODE(S) FOR CARRYING OUT THE INVENTION

Reference is now made in detail to a specific embodiment of the present invention which illustrates the best mode presently contemplated by the inventors for practicing the invention.

Figure 3:
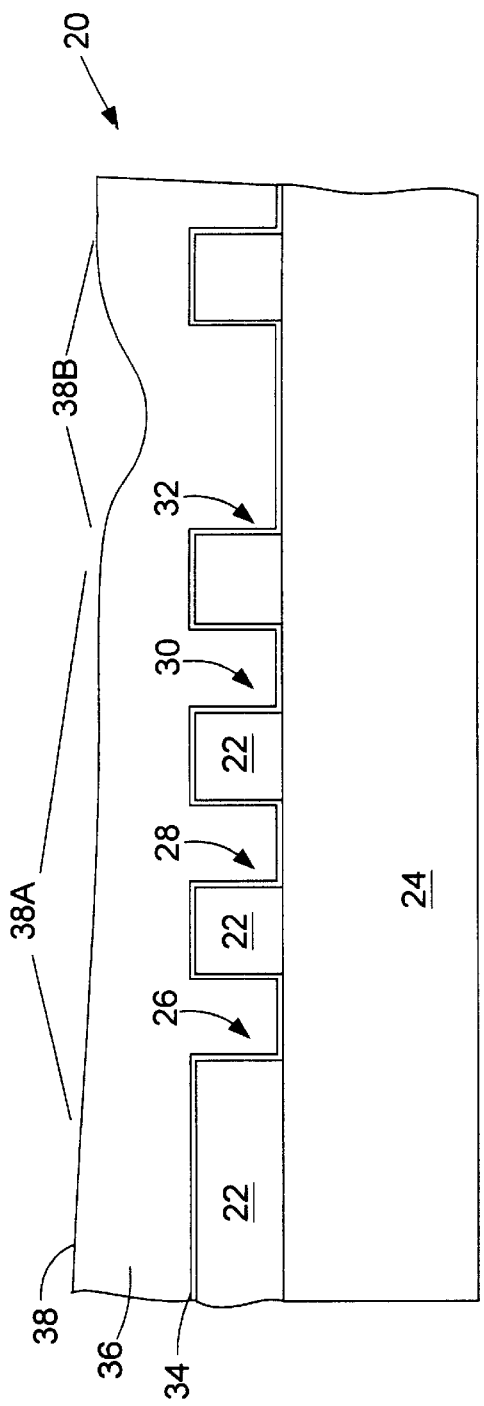
Figure 4:
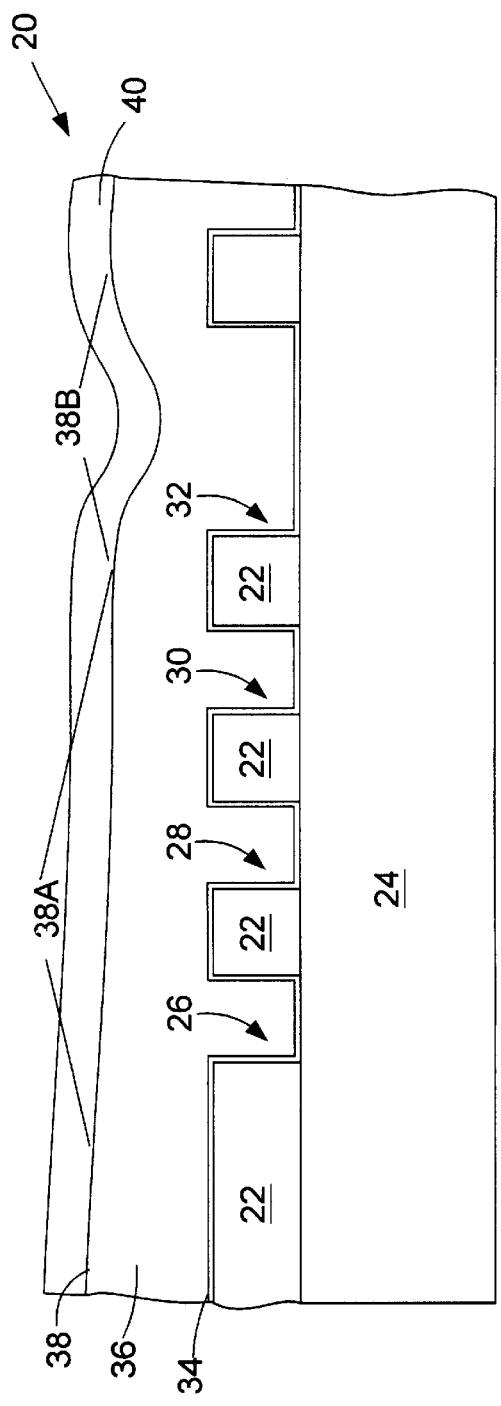
Figure 5:
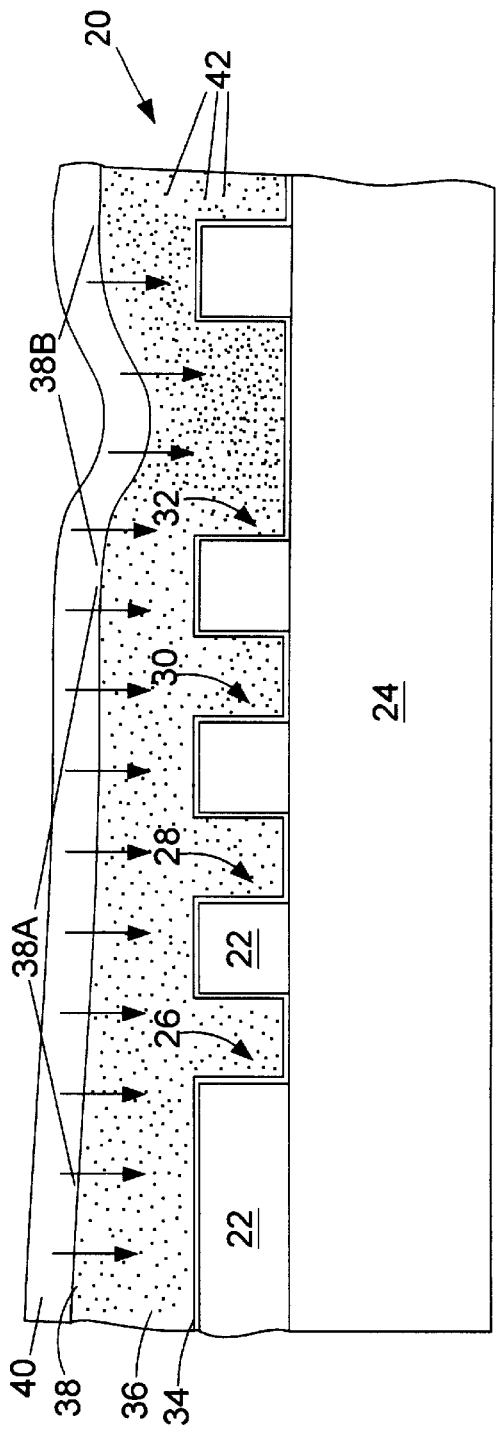
Figure 6:
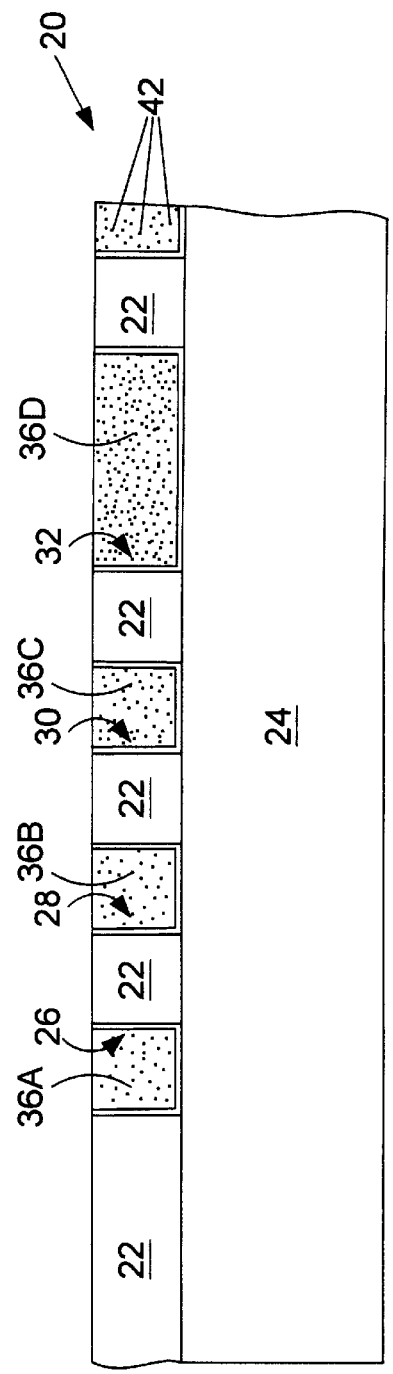
Figure 7:
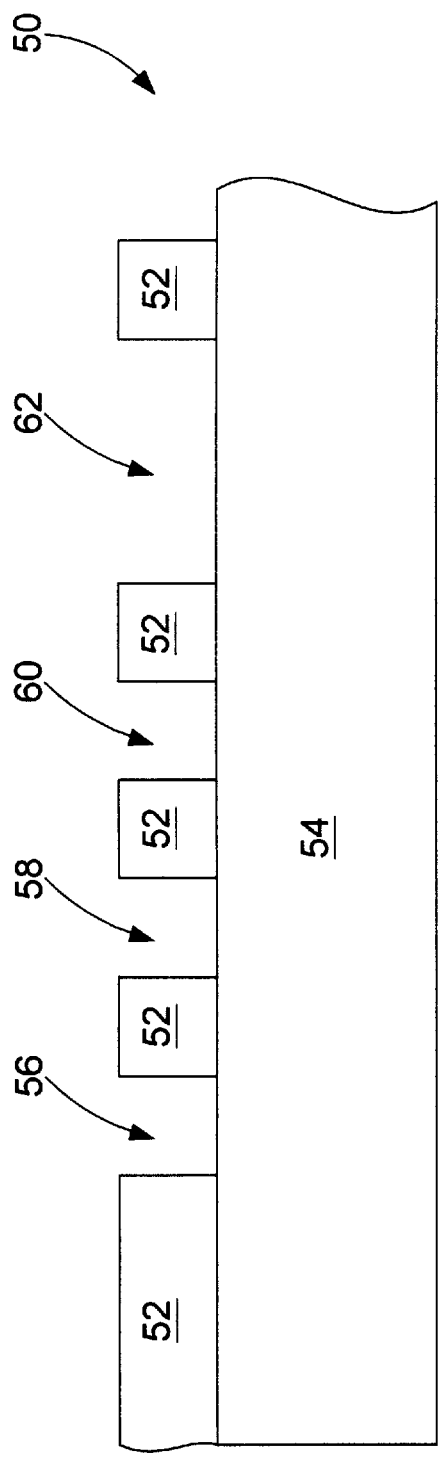
FIGS. 7–13 are cross-sectional views illustrating steps of the process of the present invention.

As shown in FIG. 7, in the fabrication of a semiconductor device 50, a dielectric layer 52 such a silicon dioxide or other material having a low dielectric consant is formed above semiconductor substrate 54, typically comprising monocrystalline silicon. It should be understood, again, that dielectric layer 52 may be an interlayer dielectric formed a number of layers above the surface of the semiconductor substrate 54.

Openings 56, 58, 60, 62 are formed in the dielectric layer 52 using conventional photolithographic and etching techniques. These openings 56–62 represent holes for forming contacts or vias or trenches for forming interconnect lines. As shown in FIG. 7, the openings each have substantially the same depth, and the width of the openings 56, 58, 60 (in close proximity to each other) are substantially the same, i.e., relatively narrow in configuration so as to have a relatively high aspect ratio, while the opening 62, on the other hand, is relatively wide in configuration so as to have a lower aspect ratio than the opening 56, 58, 16.

Figure 8:
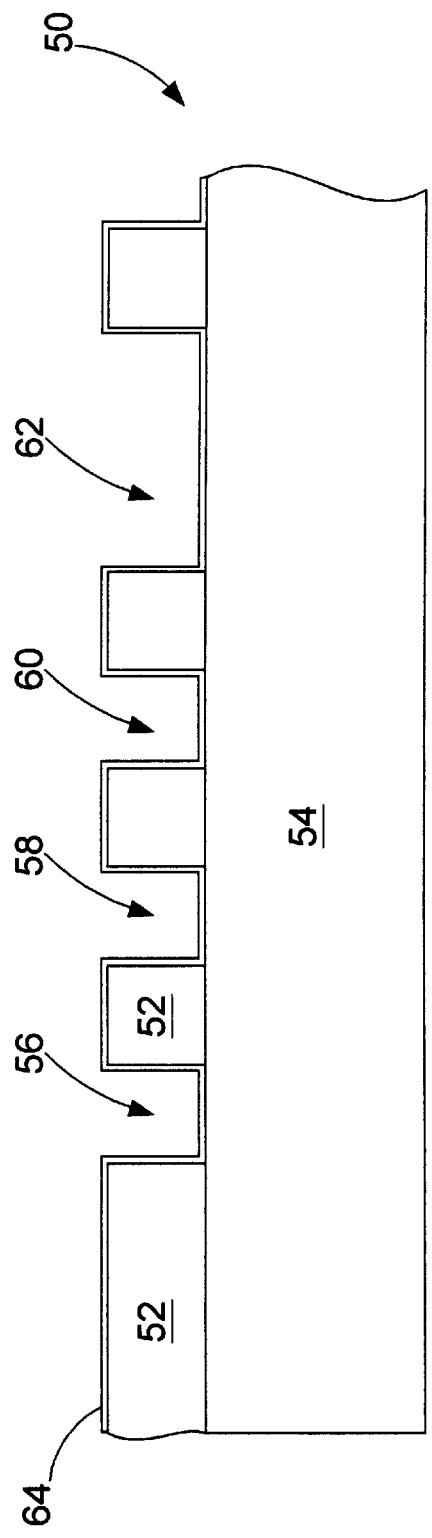

As an option a diffusion barrier layer may be deposited over the resulting structure, as is well-known. Such diffusion barrier can comprise any of a variety of materials, such as Ta, TaN, TiN, TiW, or Ti. The diffusion barrier layer can be formed at a suitable thickness, such as about 30 angstroms to about 1500 angstroms. A seed layer can be deposited on the barrier layer for enhanced nucleation and adhesion of the copper later applied. The barrier layer and seed layer are indicated by the layer 64 (FIG. 8).

Figure 9:
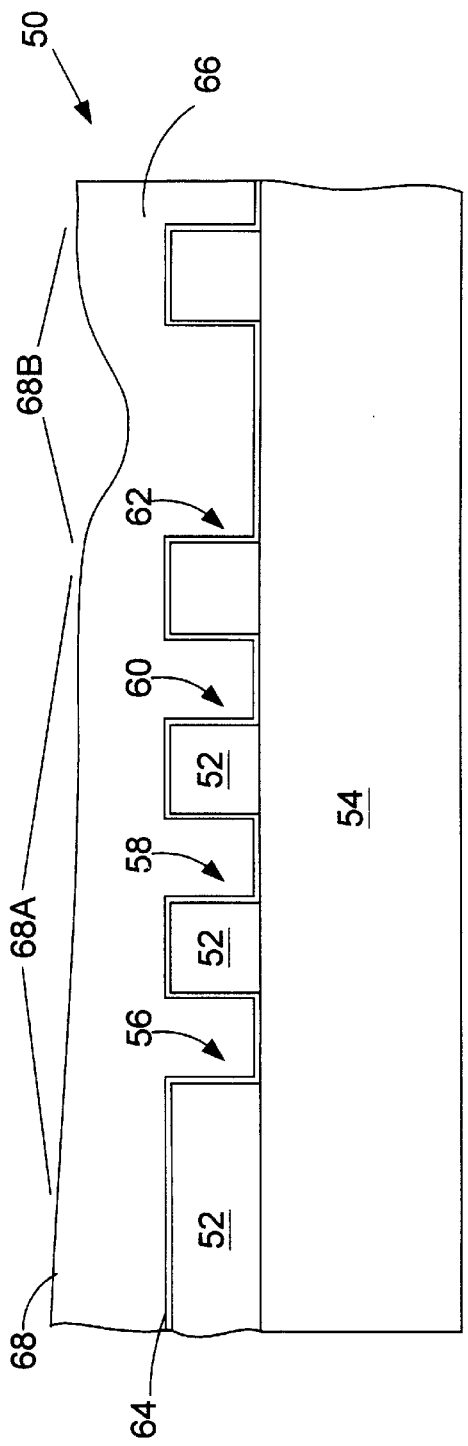

A substantially undoped copper layer 66 is deposited over the resulting structure in a single deposition step (FIG. 9) by, for example, electroplating to a sufficient thickness to fill each of the openings 56–62 with copper, forming an upper surface 68 thereof which extends above the dielectric layer 52. As previously noted because of the small feature sizes defined by the openings 56, 58, 60, and their close proximity, the surface portion 68A over these openings 56, 58, 60 is generally planar in configuration. However, because of the substantially greater width of the opening 62, the surface portion 68B over openng 62 is recessed relative to the surface portion 68A over openings, causing the overall upper surface 68 of the copper 66 to be substantially non-planar.

Figure 10:
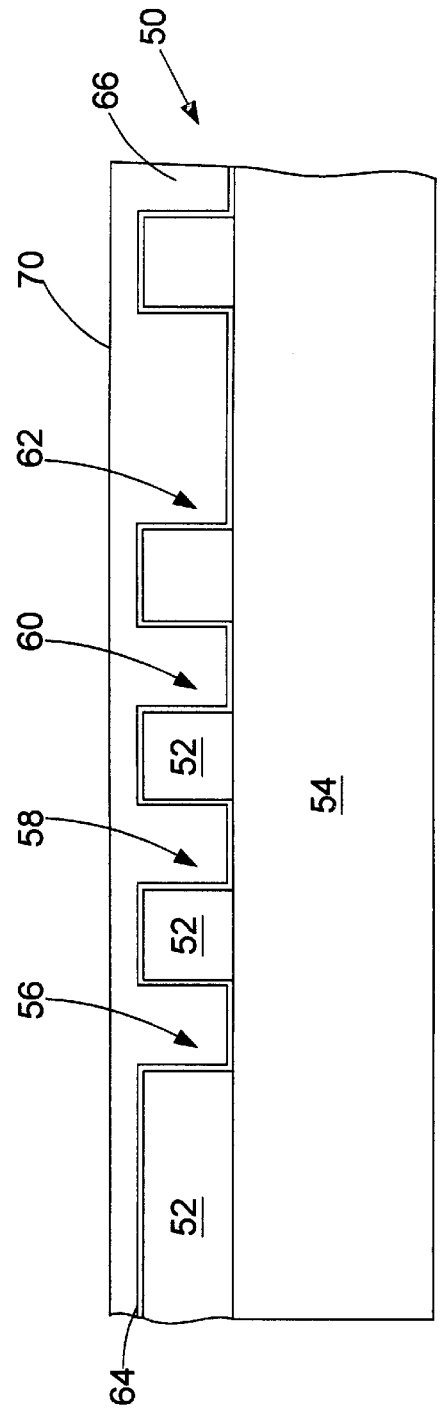

Then, a planarization step of the copper layer 66 is undertaken (FIG. 10), using, for example, chemical mechanical polish (CMP), electropolishing, or electroplating planarization. During this step, copper is removed from the layer 66, resulting in the upper surface 70 of the copper layer 66 being planarized, substantially parallel to the upper surface of the dielectric layer 52. Thus, no recess exists in the upper surface 70 of the copper layer 66, as compared to the prior art.

Figure 11:
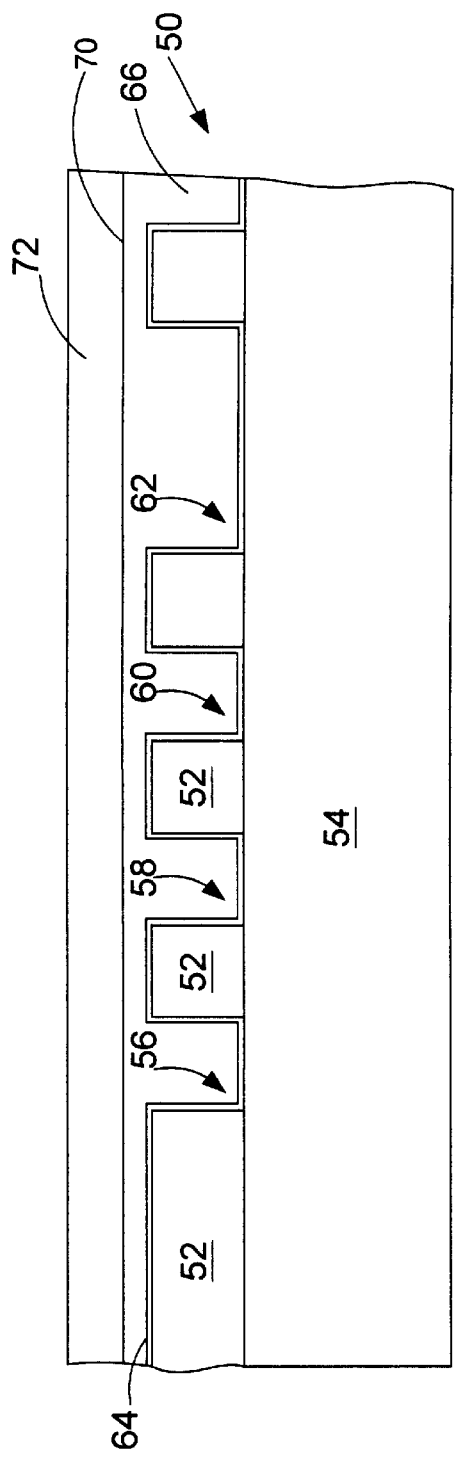
Figure 12:
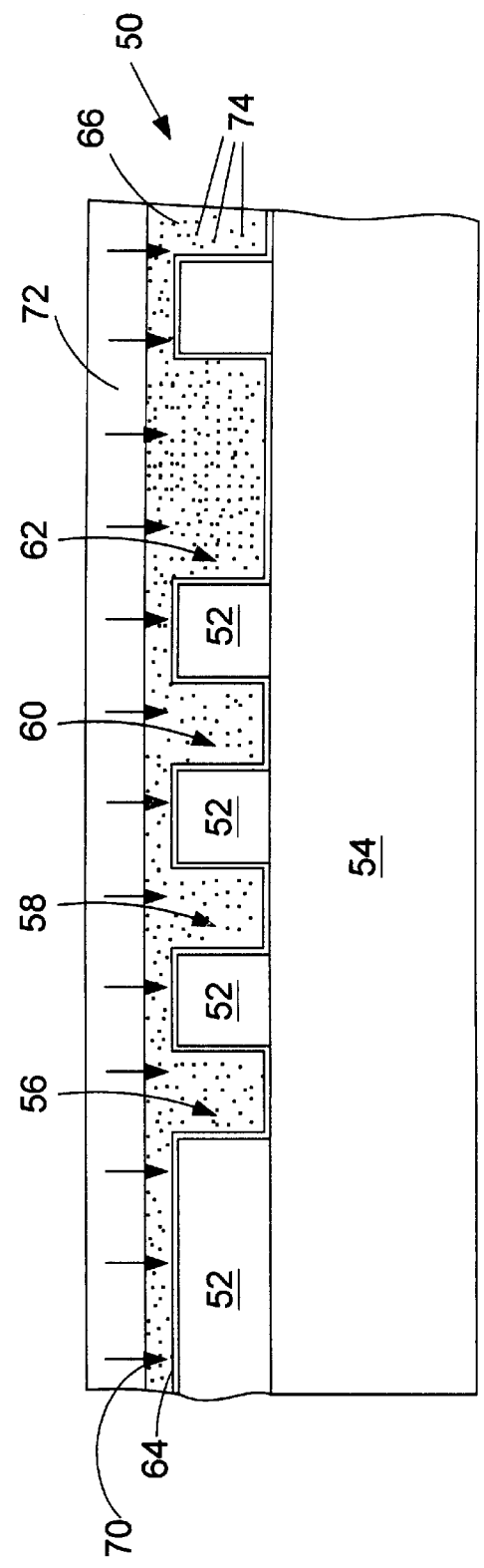

After this step, a doped layer of copper 72, i.e., an alloy of copper and a dopant element, is deposited on the upper surface 70 of the undoped copper layer 66 to a thickness of for example 500–5000 angstroms by, for example, physical vapor deposition (PVD), chemical vapor deposition (CVD), or enhanced chemical vapor deposition (ECVD) (FIG. 11). The doped copper layer 72 contains a dopant element which, upon diffusing into the undoped copper 66 to form an alloy wit the undoped copper 66, improves the electromigration resistance of the copper 66. Suitable dopant elements include Pd, Zr, Sn, Mg, Cr, and Ta. The dopant atoms are so diffused into the undoped copper 66 by undertaking an annealing step, at for example 200–400° C. for from a few minutes to one hour (FIG. 12).

Figure 13:
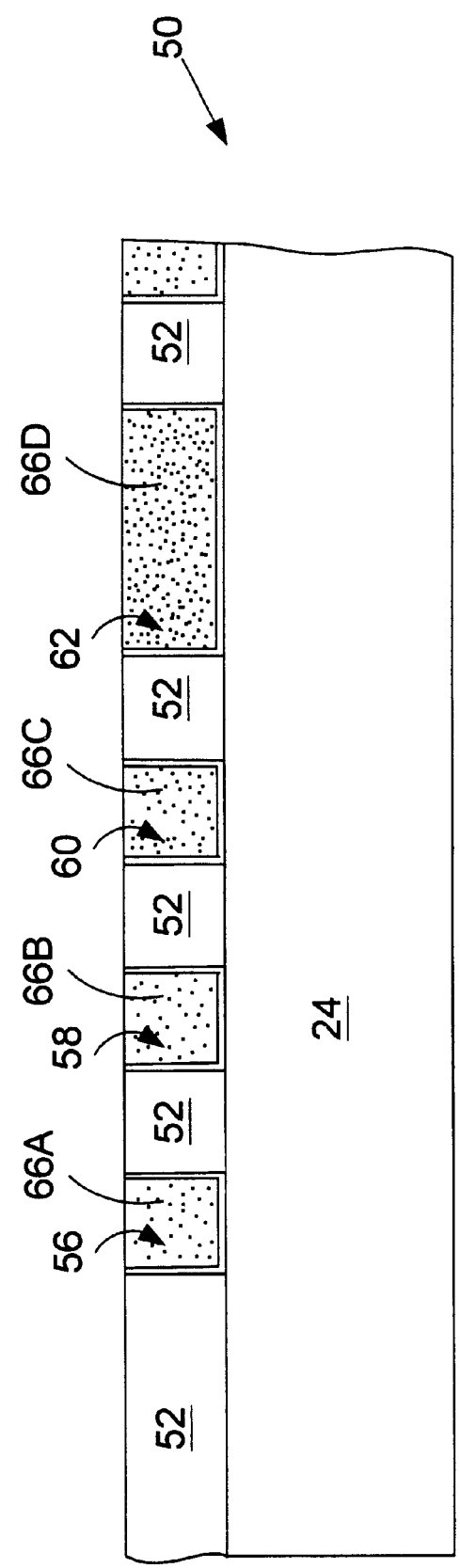

Because of the overall substantial planarity of the upper surface 70 of the layer 66, the concentration of dopant in copper in each opening 56, 58, 60, 62 will be substantially the same. Then, when a (CMP) step is undertaken to planarize the entire structure (FIG. 13) and form individual copper features 66A, 66B, 66C, 66D in the respective openings 56, 58, 60, 62, even though the copper feature 66D has a configuration different from the configuration of the copper features 66A, 66B, 66C, each of the copper features 66A, 66B, 66C, 66D will be doped to substantially the same concentration, rest in a uniformity of increased resistance to electromigration from feature to feature, independent of feature size.

As noted, the doped copper layer 72 can be deposited using a conventional PVD chamber, a simple process for achieving alloy deposition.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a semiconductor device comprising:

providing an opening in a dielectric layer;

depositing substantially undoped copper in the opening, and providing a substantially non-planar upper surface of the substantially undoped copper;

removing a portion of the substantially undoped copper to increase the planarity of the semiconductor device;

depositing a layer of copper containing a dopant element on the upper surface of the semiconductor device; and annealing to diffuse the dopant element into the copper in the opening.

2. The method of claim 1 wherein the substantially undoped copper is deposited to fill the opening.

3. The method of claim 2 wherein the step of depositing substantially undoped copper is a singe deposition step.

4. The method of claim 3 and further comprising the step of removing a portion of the substantially undoped copper to provide a substantially planar upper surface of the semiconductor device.

5. The method of claim 1 and further comprising the step of deposing the substantially undoped copper by electroplating.

6. The method of claim 1 and further comprising the step of depositing the layer of copper containing a dopant element by physical vapor deposition (PVD).

7. A method of fabricating a semiconductor device comprising:
   providing a plurality of openings in a dielectric layer, at least first and second openings of the plurality thereof having different configurations;
   depositing substantially undoped copper on the dielectric layer, Jil the openings and extending above the dielectric layer, the different configurations of the first and second openings providing that an upper surface of the substantially undoped copper is generally non-planar;
   removing a portion of the substantially undoped copper to increase the planarity of the upper surface thereof;
   depositing a layer of copper containing a dopant element on the upper surface of the substantially undoped copper; and
   annealing to diffuse the dopant element into the copper in the openings.

8. The method of claim 7 wherein the step of depositing substantially undoped copper on the dielectric layer and in the openings is a single deposition step.

9. The method of claim 8 and further comprising the step of removing a portion of the substantially undoped copper to provide a substantially planar upper surface thereof.

10. The method of claim 9 and further comprising planarizing the semiconductor device after the annealing step.

11. The method of claim 8 and further comprising the step of depositing the substantially undoped copper by electroplating.

12. The method of claim 8 and further comprising the step of depositing the layer of copper containing a dopant element by physical vapor deposition (PVD).

* * * * *

UNITED STATES PATENT AND TRADEMARK OFFICE
CERTIFICATE OF CORRECTION

PATENT NO. : 6,518,185 B1
DATED : February 11, 2003
INVENTOR(S) : Pin-Chin Connie Wang et al.

It is certified that error appears in the above-identified patent and that said Letters Patent is hereby corrected as shown below:

Column 5,
Line 13, "Jil" should read -- filling --.

Signed and Sealed this

Twenty-fifth Day of March, 2003

JAMES E. ROGAN
*Director of the United States Patent and Trademark Office*